United States Patent
Tanisaka et al.

(10) Patent No.: US 10,193,301 B2
(45) Date of Patent: Jan. 29, 2019

(54) METHOD OF MANUFACTURING LIGHT EMITTING DEVICE AND LIGHT EMITTING DEVICE

(71) Applicant: NICHIA CORPORATION, Anan-shi, Tokushima (JP)

(72) Inventors: Shingo Tanisaka, Komatsushima (JP); Shingo Masui, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 15/938,059

(22) Filed: Mar. 28, 2018

(65) Prior Publication Data

US 2018/0287338 A1 Oct. 4, 2018

(30) Foreign Application Priority Data

Mar. 31, 2017 (JP) .................................. 2017-070631
Oct. 6, 2017 (JP) .................................. 2017-196225

(51) Int. Cl.
*H01S 3/04* (2006.01)
*H01S 5/02* (2006.01)
(Continued)

(52) U.S. Cl.
CPC ............ *H01S 5/0218* (2013.01); *H01S 5/021* (2013.01); *H01S 5/0202* (2013.01);
(Continued)

(58) Field of Classification Search
CPC .... H01S 5/02469; H01S 5/0202; H01S 5/021; H01S 5/0215; H01S 5/0217; H01S 5/0218; H01S 5/02272; H01S 5/0425; H01S 5/22; H01S 5/34333; H01S 5/32341; H01S 5/02484; H01S 5/0216
See application file for complete search history.

(56) References Cited

U.S. PATENT DOCUMENTS 5,837,561 A * 11/1998 Kish, Jr. ............... H01S 5/0217
438/47
2002/0142503 A1* 10/2002 Miyachi .............. H01S 5/32341
438/29

(Continued)

FOREIGN PATENT DOCUMENTS

JP 2002-299739 A 10/2002
JP 2003-273463 A 9/2003
JP 2009-123939 A 6/2009

*Primary Examiner* — Kinam Park
(74) *Attorney, Agent, or Firm* — Global IP Counselors, LLP

(57) ABSTRACT

A method of manufacturing a light emitting device includes: providing a wafer including a conductive first substrate, a laser element structure on an upper side of the first substrate, and an upper surface electrode on an upper surface of the element structure; bonding the wafer to a second substrate at an upper surface electrode side of the wafer; removing a portion of the first substrate to reduce a thickness of the wafer; forming a lower surface electrode on a lower surface of the first substrate at which the removing of the portion of the first substrate has been performed; singulating the wafer to obtain a laser element; and mounting the laser element on a submount such that the lower surface electrode faces the submount.

17 Claims, 11 Drawing Sheets

(51) Int. Cl.
  *H01S 5/024* (2006.01)
  *H01S 5/042* (2006.01)
  *H01S 5/22* (2006.01)
  *H01S 5/022* (2006.01)
  *H01S 5/323* (2006.01)
  *H01S 5/343* (2006.01)

(52) U.S. Cl.
  CPC .......... *H01S 5/0215* (2013.01); *H01S 5/0216* (2013.01); *H01S 5/0217* (2013.01); *H01S 5/02272* (2013.01); *H01S 5/02469* (2013.01); *H01S 5/02484* (2013.01); *H01S 5/0425* (2013.01); *H01S 5/22* (2013.01); *H01S 5/32341* (2013.01); *H01S 5/34333* (2013.01)

(56) References Cited

U.S. PATENT DOCUMENTS

| | | | | |
|---|---|---|---|---|
| 2004/0245543 | A1* | 12/2004 | Yoo | H01L 33/0079 257/103 |
| 2005/0084201 | A1* | 4/2005 | Akashi | G02B 6/4201 385/14 |
| 2010/0084669 | A1* | 4/2010 | Furukawa | H01L 33/0079 257/94 |
| 2011/0211610 | A1* | 9/2011 | Saito | B82Y 20/00 372/50.121 |
| 2013/0027623 | A1* | 1/2013 | Negishi | H01L 25/0753 349/42 |
| 2016/0372893 | A1* | 12/2016 | McLaurin | H01L 24/95 |

* cited by examiner

METHOD OF MANUFACTURING LIGHT EMITTING DEVICE AND LIGHT EMITTING DEVICE

CROSS REFERENCE TO RELATED APPLICATIONS

This application claims priority to Japanese Patent Application No. 2017-070631 filed on Mar. 31, 2017, and Japanese Patent Application No. 2017-196225 filed on Oct. 6, 2017, the disclosures of which are hereby incorporated by reference in their entireties.

BACKGROUND

1. Technical Field

The present disclosure relates to a method of manufacturing a light emitting device and the light emitting device.

2. Description of Related Art

In formation of a semiconductor laser, a semiconductor layer are layered on a growth substrate.

Further, for various purposes, a wafer in which the semiconductor layer is formed may be bonded to a supporting substrate, and thereafter the growth substrate may be removed.

For example, for the purpose of improving the cleavage, there has been proposed a method including: bonding semiconductor layers to a supporting substrate having a higher cleavage property; and thereafter removing the growth substrate (e.g., JP 2002-299739 A).

Further, for the purpose of reducing occurrence of a crack attributed to the variations in thickness of a semiconductor layer, there has been proposed a method including: bonding a supporting substrate to a semiconductor layer having a step; and thereafter removing the growth substrate (JP 2009-123939 A and others).

SUMMARY

The higher the output of a semiconductor laser, the greater the amount of heat generation of the semiconductor laser is. Accordingly, there is an increasing demand for improved heat dissipation performance of a semiconductor laser.

One object of the present disclosure is to provide a method of manufacturing a light emitting device and the light emitting device that allow improvement in heat dissipation performance.

(1) A method of manufacturing a light emitting device according to one embodiment of the present invention includes: providing a wafer including a conductive first substrate, a laser element structure on an upper side of the first substrate, and an upper surface electrode on an upper surface of the element structure; bonding the wafer to a second substrate at an upper surface electrode side of the wafer; removing a portion of the first substrate to reduce a thickness of the wafer; forming a lower surface electrode on a lower surface of the first substrate at which the removing of the portion of the first substrate has been performed; singulating the wafer to obtain a laser element; and mounting the laser element on a submount such that the lower surface electrode faces the submount.

(2) A light emitting device according to one embodiment of the present invention includes: a submount; and a laser element. The laser element includes: a conductive first substrate; a laser element structure on an upper side of the first substrate; a lower surface electrode on a lower surface of the first substrate; an upper surface electrode on an upper surface of the element structure; and a second substrate bonded to the upper surface electrode. The first substrate has a thickness smaller than a thickness of the second substrate. The submount is bonded to the laser element such that the submount faces the lower surface electrode.

According to certain embodiments of the present invention, a method of manufacturing a light emitting device and the light emitting device that allow for improving heat dissipation performance and the light emitting device.

DETAILED DESCRIPTION OF EMBODIMENTS

Figure 1A:
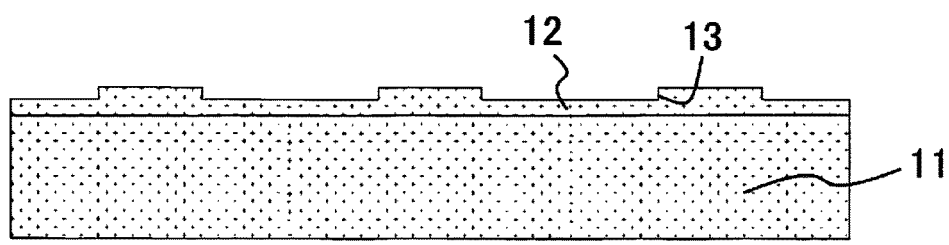
FIG. 1A is a schematic cross-sectional view showing a method of manufacturing a light emitting device of Example 1.

Each of the embodiments described below is an example for illustrating the technical idea of the present invention, and is not intended to limit the scope of the present invention to the following. Further, the size, positional relationship and the like of members shown in the drawings may be exaggerated for the sake of clarity. Still further, the same or similar member is basically denoted by the same term or reference numerals, and a repetitive description thereof will be omitted as appropriate.

Method of Manufacturing Light Emitting Device

A method of manufacturing a light emitting device according to one embodiment includes: providing a wafer including a conductive first substrate, a laser element structure on an upper side of the first substrate, and an upper surface electrode on an upper surface of the element structure; bonding the wafer to a second substrate at an upper surface electrode side of the wafer; removing a portion of the first substrate to reduce a thickness of the wafer; forming a lower surface electrode on a lower surface of the first substrate at which the removing of the portion of the first substrate has been performed; singulating the wafer to obtain a laser element; and mounting the laser element on a submount such that the lower surface electrode faces the submount.

In this manner, by reducing the thickness of the wafer in which the laser element structure is formed and mounting the laser element on the submount, the light emitting region of the laser element (that is, the active layer), which is the heat source, can be positioned closer to the submount. Accordingly, dissipation of heat to the submount is facilitated, so that the thermal resistance of the laser element can be reduced. Further, necessity of providing an insulating layer between the light emitting point of the laser element and the submount is eliminated, the thermal resistance of the laser element further reduces.

Further, a reduction in thickness of the wafer by removing a portion of the first substrate allows the light emitting region to be away from the submount, as compared with the case where the first substrate is completely removed. Accordingly, the light-emitting end surface of the laser element is not required to be located at greatly outer side of the submount in view of tolerance in mounting accuracy. Therefore, the light-emitting end surface may not be located at an outer side the submount, or distance between the light-emitting end surface and the submount can be reduced. Accordingly, heat of the light-emitting end surface and its vicinity can be easily dissipated to the submount, so that the thermal resistance of the laser element can be reduced.

Providing Wafer

A wafer including a first substrate, which is conductive, a laser element structure formed on an upper side of the first substrate, and an upper surface electrode formed at an upper surface of the element structure is provided.

As shown in FIG. 1A, an appropriate laser element structure 12 is crystal-grown on a conductive first substrate 11.

Examples of the conductive first substrate 11 include a compound semiconductor substrate such as a GaN substrate or a GaAs substrate, and an elemental semiconductor substrate of silicon or the like. Among these, the conductive first substrate 11 is preferably a crystalline substrate having the cleavage property. As used herein, "having the cleavage property" refers to that the substrate has an easy-cleavage plane, along which cleaving is easily carried out. For example, when the first substrate 11 is a GaN substrate, the M-plane (that is, the (10-10) plane) is the easily-cleaved plane. In this case, the element structure 12 is preferably formed such that the C-plane (that is, the (0001) plane), which is perpendicular to the M-plane, is a main surface. In providing of the wafer, the first substrate has a thickness in a range of, for example, 50 μm to 2 mm. The first substrate 11 may have a surface with irregularities, or may have an off angle. The off angle is preferably, for example, 1 degree or less.

For the laser element structure, a semiconductor layered body is formed. The semiconductor layered body includes, for example, in order from the first substrate side, an n-side semiconductor layer, an active layer, and a p-side semiconductor layer. Each of the n-side semiconductor layer and the p-side semiconductor layer may include an n-type semiconductor layer and a p-type semiconductor layer, and may partially include an undoped layer. The active layer has, for example, a multi-quantum-well structure or a single-quantum-well structure. The semiconductor layered body may be epitaxially grown on the first substrate. Examples of a material of the semiconductor layered body include a Group III-V compound semiconductor such as a GaN-based semiconductor, a GaP-based semiconductor, and a GaAs-based semiconductor. For example, a nitride semiconductor expressed by a general formula $In_xAl_yGa_{1-x-y}N$ ($0 \leq x$, $0 \leq y$, $x+y \leq 1$) is used.

A waveguide is formed at the semiconductor layered body by any known method. For example, using a photolithography and etching technique, a portion of the semiconductor layered body is removed such that a stripe-shaped ridge is formed at the upper surface of the semiconductor layered body, that is, at a surface of the p-side semiconductor layer. Thus, a waveguide is formed.

Then, the upper surface electrode is formed at the upper surface of the laser element structure.

The upper surface electrode is electrically connected to the p-side semiconductor layer. The upper surface electrode may include, for example, a first p-electrode in contact with the upper surface of the p-side semiconductor layer, and a second p-electrode, which is a pad electrode disposed on the first p-electrode for connection to an external component. The first p-electrode is preferably formed on the upper surface of the p-side semiconductor layer corresponding to the waveguide, and may be formed only on the upper surface of the ridge. The second p-electrode may be disposed only on the ridge, or may be formed to extend from a region above the ridge to the upper surface of the p-side semiconductor layer.

The upper surface electrode may be a single-layer film or a layered film of a metal such as, palladium, platinum, nickel, gold, titanium, tungsten, copper, silver, zinc, tin, indium, chromium, aluminum, iridium, rhodium, or alloy of these metals. The upper surface electrode may be a conductive oxide film such as ITO. In this electrode, in order to facilitate bonding to the second substrate which will be described below, the uppermost layer may be made of gold. Alternatively, in order to undergo the liquid phase diffusion bonding, the upper surface electrode may be a film with a layered structure in which the uppermost layer is made of a low melting point material such as tin, and a layer immediately below the uppermost layer is made of a material for alloying such as nickel. Thus, the upper surface electrode can undergo the liquid phase diffusion bonding in which, for example, tin is molten at about 232° C., to form $Ni_3Sn_4$ alloy and nickel. Using the liquid phase diffusion bonding allows the bonding portion to be extended to a portion other than the ridge, during bonding which will be described later.

For example, the first p-electrode may have a thickness in a range of 10 nm to 1000 nm, and the second p-electrode may have a thickness in a range of 1000 nm to 1 μm.

Before or after forming the upper surface electrode, an insulating layer is preferably formed at a region other than the contact region between the upper surface electrode and the semiconductor layer, for example, at the upper surface and lateral surfaces of the p-side semiconductor layer. In the laser element structure including a nitride semiconductor, forming the ridge at the upper surface of the element structure and forming an insulating layer being relatively lower in refractive index at a region other than the ridge allow light to be effectively confined in the optical waveguide. The insulating layer may be made of oxide, nitride, or oxynitride of Zr, Si, V, Nb, Hf, Ta, Al, Ce, In, Sb, Zn, etc. The insulating layer having relatively lower refractive index is preferably greatly different in refractive index from a refractive index of the semiconductor layer (for example, GaN).

Examples of such a material include $SiO_2$. The insulating layer may have a thickness in a range of, for example, about 100 nm to 1500 nm.

Further, in the laser element including a nitride semiconductor, a material having a relatively higher thermal resistance such as oxide film may be used for the electrode material, the insulating layer, or the like. In this case, when junction-down mounting is performed, such a material having higher thermal resistance is disposed between the laser element and the submount. This arrangement may impair heat dissipation performance. On the other hand, mounting the wafer, in which the laser element structure is formed, on a submount such that the lower surface electrode (i.e., n-electrode) side of the first substrate faces the submount, the thermal resistance can be reduced as compared with the junction-down mounting. Further, as will be described below, in the case where a substrate having electrical resistance lower than that of the first substrate is employed as the second substrate (for example, a boron-doped Si substrate or the like), as compared with the case where a laser element having the first substrate with a thickness greater than a thickness of the second substrate is junction-down mounted, the electrical resistance can be reduced and the driving voltage of the laser element can be reduced.

Accordingly, due to these two effects, that is, the reduced thermal resistance and the reduced voltage, an efficiency of the laser element can be further increased.

Bonding Wafer to Second Substrate

The second substrate bonded to the laser element structure is preferably cleavable together with the first substrate and/or the laser element structure and, accordingly, is preferably made of a material having the cleavage property. That is, the second substrate is preferably a crystalline substrate having an easy-cleaved plane. Further, in view of supplying electricity to the second substrate after the laser element is mounted, the second substrate is preferably conductive. The second substrate further preferably has a lower electrical resistance, for example, than the GaN substrate. Examples of the second substrate may include a Si substrate and a GaAs substrate. In view of manufacturing the laser element inexpensively, a Si substrate is preferable.

The second substrate has a first surface facing the laser element structure, and a second surface opposite to the first surface. A conductive layer is preferably disposed on at least the first surface of the second substrate, more specifically. The conductive layer may be a single-layer film or a layered film using a metal such as palladium, platinum, nickel, gold, titanium, tungsten, copper, silver, zinc, tin, indium, chromium, aluminum, iridium, rhodium, or alloy of these metals. For the second substrate, a conductive oxide film such as ITO may be used. Among these, in order to facilitate bonding, a material that is the same as that of the uppermost surface of the upper surface electrode of the element structure is preferably used for the uppermost surface of the conductive layer, more preferably gold is used. Further, a conductive layer can be formed also the second surface of the second substrate, which is opposite to the first surface. In the case where a wire is connected to the other surface side of the second substrate, for example, it is preferable to dispose a conductive layer having an uppermost layer made of a material of good bondability to the wire, such as gold.

In view of ensuring strength, the second substrate has a thickness greater than that of the first substrate after reducing the thickness of the wafer, which will be described below. The thickness of the second substrate is preferably great enough to reduce the influence of warpage of the first substrate, and specifically preferably in a range of about 300 µm to 500 µm. After the reducing the thickness of the first substrate, which will be described below, the second substrate can also be polished. The thickness of the second substrate after the polishing is greater than the thickness of the first substrate after reducing of the thickness, and may be in a range of 100 µm to 1000 µm, preferably in a range of 200 µm to 700 µm.

Such a second substrate is bonded to the laser element structure. That is, the second substrate and the laser element structure are bonded to each other such that the upper surface electrode disposed on the upper surface of the laser element structure faces the conductive layer on the second substrate. At this time, the first substrate and the second substrate are preferably aligned so that their respective cleaving directions are parallel to each other, that is, so that the easy-cleavage plane of the first substrate and the easy-cleaved plane of the second substrate are parallel to each other. Note that, as in Example 1 which will be described below, while the easy-cleavage plane of the first substrate is perpendicular to the main surface, the easy-cleavage plane of the second substrate is not perpendicular but inclined relative to the main surface. Therefore, they may not be parallel to each other in the strict sense. With such a bonding, by cleaving the second substrate, the first substrate can also be cleaved. Further preferably, the easy-cleavage plane of the laser element structure is also parallel to the easy-cleavage plane of the first substrate and that of the second substrate. Still further, because resonator end surfaces of the laser element are preferably formed by cleaving, the first substrate and the second substrate are further preferably aligned so that a surface obtained by performing cleaving along the easy-cleavage plane becomes each resonator end surface. In view of these, a GaN substrate is preferably used for the first substrate, and a Si substrate is preferably used for the second substrate. The expression "the easy-cleavage plane of the first substrate and that of the second substrate being parallel to each other" refers to that the easy-cleavage plane of the first substrate and that of the second substrate are parallel to the extent that cleaving of the second substrate can cause cleaving of the first substrate. For example, deviation of about ±0.2 degrees is permitted.

If a metal layer such as an electrode is present at a dividing position, the metal layer may expand and attach to a surface obtained by dividing. Accordingly, it is preferable that none of the upper surface electrode, the lower surface electrode, and the conductive layer are present at the dividing position, particularly the position to be subject to dividing for forming the resonator end surfaces. In order to attain such a positional relationship, the upper surface electrode, the lower surface electrode, and the conductive layer are preferably formed other than the division-planned position.

The bonding may be carried out by the liquid phase diffusion bonding, the solid phase diffusion bonding, the heat pressure bonding, or the like. For example, using the heat pressure bonding allows for substantially preventing deformation of the surface of the electrodes. Accordingly, in the case where the upper surface electrode on the upper surface of the element structure is formed, for example, on the upper surface of the ridge, a top portion of projecting portion of the upper surface electrode above the ridge and the conductive layer on the second substrate are bonded to each other, and the other part defines a gap. In the case where the second substrate is left as will be described below, it is considered to be preferable to employ the diffusion bonding such as the solid phase diffusion bonding, which provides greater adhesion than the heat pressure bonding.

Reducing Thickness of Wafer

In order to reduce the thickness of the wafer, a portion of the first substrate is removed from a lower portion. The removing is preferably performed by polishing and/or dry etching. In the case where polishing is performed, in order to reduce the influence of warp of the wafer, it is preferable that the wafer is tentatively bonded to a tentative substrate having a thickness greater than that of the second substrate via wax or the like at second substrate side of the wafer, and then a portion of the first substrate is removed. Examples of a material of the tentative substrate include sapphire, and the thickness of the tentative substrate is, for example, approximately 2 mm.

For example, using a method in which a thermal decomposition layer that will be thermally decomposed by laser irradiation is disposed between the first substrate and the element structure and the first substrate is removed from the element structure by thermally decomposing the thermal decomposition layer, as described in JP 2009-123939 A, may lead to damage of the active layer due to heat generated by the thermal decomposition. On the other hand, in the present embodiment, reducing of the thickness of the wafer is performed by polishing and/or dry etching. Thus, laser irradiation which may invite such thermal damage can be eliminated.

Chemical mechanical polishing (CMP) and/or dry etching may also be employed at the finishing of the mechanical polishing. It is preferable that the thickness of the first substrate is reduced to, for example, approximately 0.5 μm to 8 μm, by polishing or dry etching. For example, the thickness is reduced to approximately 3 μm. Further, the shortest distance between the lower surface of the first substrate after the reducing the thickness and the active layer (particularly the well layer) is preferably in a range of 2 μm to 9.5 μm. Thus, the emitted laser light is less easily incident on the submount.

Forming Lower Surface Electrode

On the surface of the wafer at which the reducing of the thickness is performed (a surface of the first substrate away from the laser element structure), the lower surface electrode is formed. A material and/or layered structure of the lower surface electrode may be the same with or different from that of the upper surface electrode. The electrode can have an appropriate thickness in accordance with a material thereof. The lower surface electrode may be, for example, a single-layer film or a layered film for which a metal such as palladium, platinum, nickel, gold, titanium, tungsten, copper, silver, zinc, tin, indium, chromium, aluminum, iridium, rhodium, or alloy thereof is used. A thickness of the lower surface electrode may be in a range of, for example, 100 nm to 5 μm.

In the case where the tentative substrate is provided in the previous step, the tentative substrate is preferably removed after the lower surface electrode is formed. Further, as necessary, the thickness of the second substrate may be reduced to any value. The reducing of the thickness of the second substrate can facilitate singulating the wafer being the later operation.

Further, in the case where the reducing of the thickness of the second substrate is performed, in any later step, a conductive layer is preferably formed on the surface of the second substrate at which the reducing of thickness is performed (i.e., the second surface). A material and/or a layered structure of the conductive layer on the second surface of the second substrate may be the same or different from, the conductive layer on the first surface of the second substrate, the lower surface electrode, or the upper surface electrode. The conductive layer on the second surface is used for, after the obtained light emitting device is mounted on a circuit board or the like, connecting with a wire or the like to establish electrical connection.

Singulating Wafer

After the lower surface electrode is formed on the lower surface of the first substrate, the first substrate and the second substrate are singulated simultaneously. The singulating generally includes dividing for forming the resonator end surfaces and dividing in the direction crossing the resonator end surfaces, and these dividing operations may be performed in any order. For example, a groove for division is formed at least one of the first substrate and the second substrate. In the case where the groove is formed in each of the first substrate and the second substrate, the groove of the first substrate and the groove of the second substrate are preferably formed so as to be located along the same line in a plan view. In the case where at least one of the first substrate and the second substrate contains an opaque material, it is difficult to form the grooves along the same line in a plan view. Therefore, the groove is preferably formed only in the second substrate. With the first substrate and the laser element structure each having a small thickness, the wafer can be divided by the forming the groove only in the second substrate. The thickness of the wafer excluding the second substrate is smaller than the second substrate. The groove can be formed using a laser scribing device, for example. The groove may be formed to be a line, or a plurality of grooves collectively constitute a broken line configuration. When the second substrate has the cleavage property, the groove is preferably broken line-like along the easy-cleavage plane. In the case where a line-like groove crossing the wafer is formed, the dividing direction tends to meander unless the groove perfectly matches with the easy-cleavage plane. On the other hand, with a broken line-like groove not perfectly matching with the easy-cleavage plane, the interval in the broken line-like groove is cleaved in the direction along the easy-cleavage plane. After the groove is formed, the first substrate and the second substrate are cleaved simultaneously. The cleaving can be performed by pressing a blade or the like against the surface opposite to the surface where the groove is formed.

The direction crossing the resonator end surfaces may be a direction crossing the resonator end surfaces at an angle of approximately 90±1 degrees.

The wafer is singulated into laser elements by the division in two directions as described above.

After the resonator end surfaces are formed, in any appropriate step, a reflecting mirror is preferably formed at each of a light-emitting-side surface and the opposite light-reflecting-side surface. For example, a first dividing for forming the resonator end surfaces is performed; a reflecting mirror forming is performed; and thereafter a second dividing in a direction crossing the resonator end surfaces is performed. The reflecting mirror may be an oxide film, a nitride film, an oxynitride film, or a combination of these. For example, a dielectric multilayer film made of two or more of $SiO_2$, $ZrO_2$, $TiO_2$, $Al_2O_3$, $Nb_2O_5$, SiN, AlN, SiON, AlON, and the like may be employed. With the resonator end surfaces formed by cleaving, the reflecting mirror is formed with improved reproducibility.

Mounting on Submount

While maintaining the state where the laser element structure is bonded to the second substrate, the laser element obtained by the singulation can be mounted on a submount such that the lower surface electrode on the laser element faces the submount. The submount is preferably made of a material having a good heat dissipation property, for example, SiC, AlN or the like.

The mounting is performed using, for example, a conductive bonding material such as AuSn eutectic solder.

Light Emitting Device

Figure 1B:
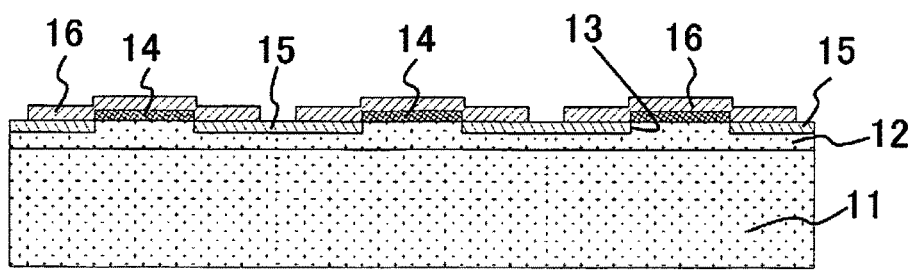
FIG. 1B is a schematic cross-sectional view showing the method of manufacturing the light emitting device of Example 1.
Figure 1C:
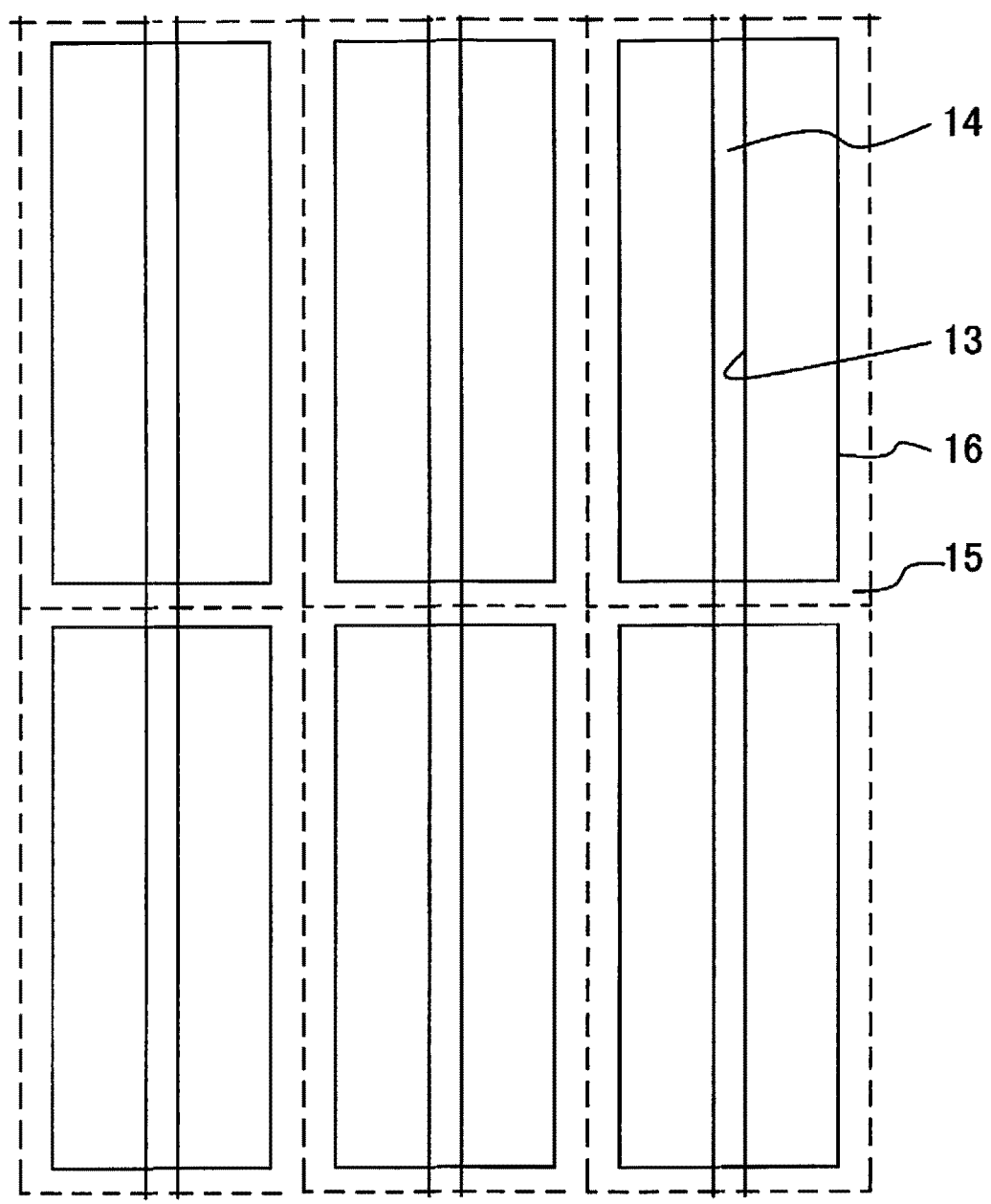
FIG. 1C is a schematic plan view showing the method of manufacturing the light emitting device of Example 1.
Figure 1D:
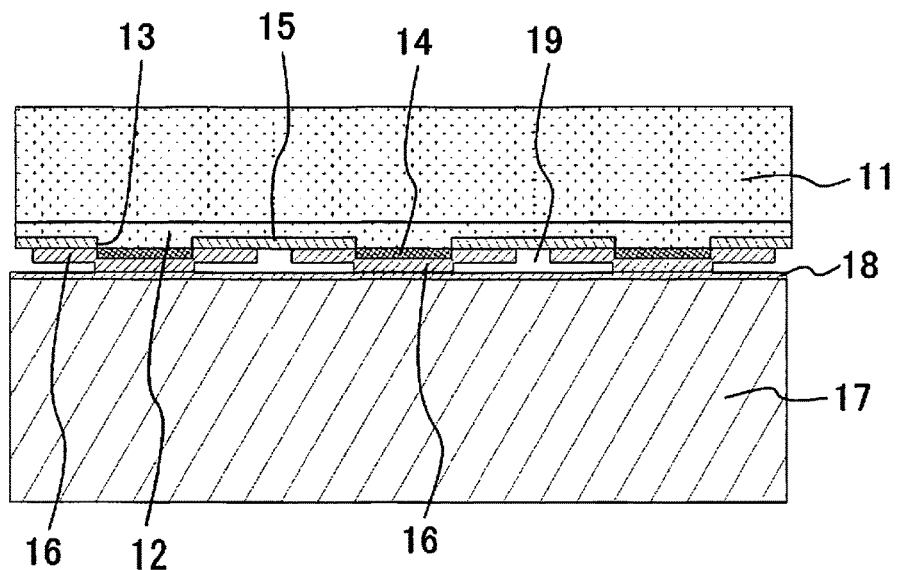
FIG. 1D is a schematic cross-sectional view showing the method of manufacturing the light emitting device of Example 1.
Figure 1E:
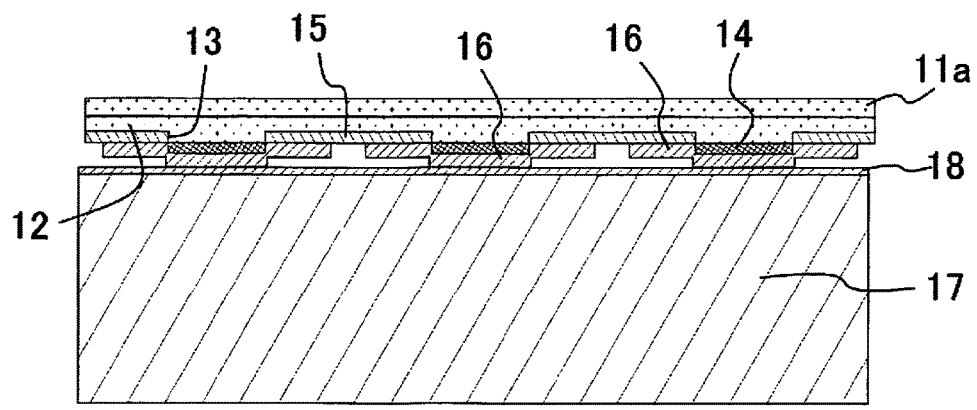
FIG. 1E is a schematic cross-sectional view showing the method of manufacturing the light emitting device of Example 1.
Figure 1F:
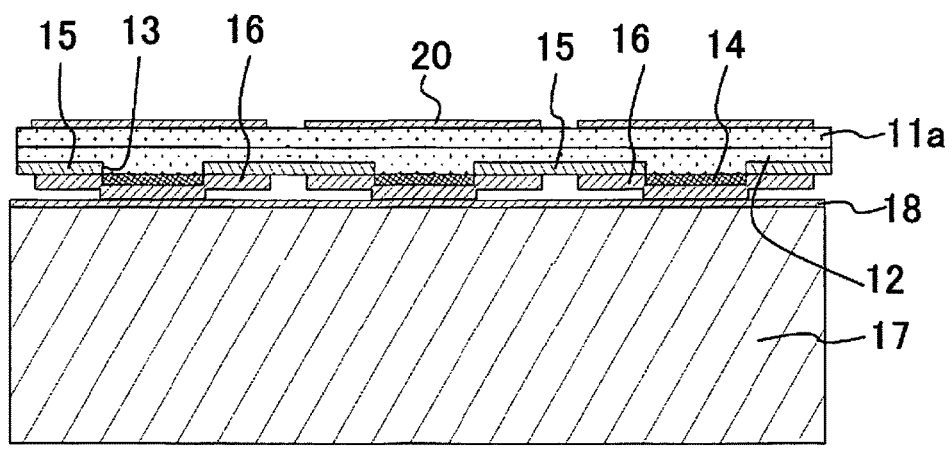
FIG. 1F is a schematic cross-sectional view showing the method of manufacturing the light emitting device of Example 1.
Figure 1G:
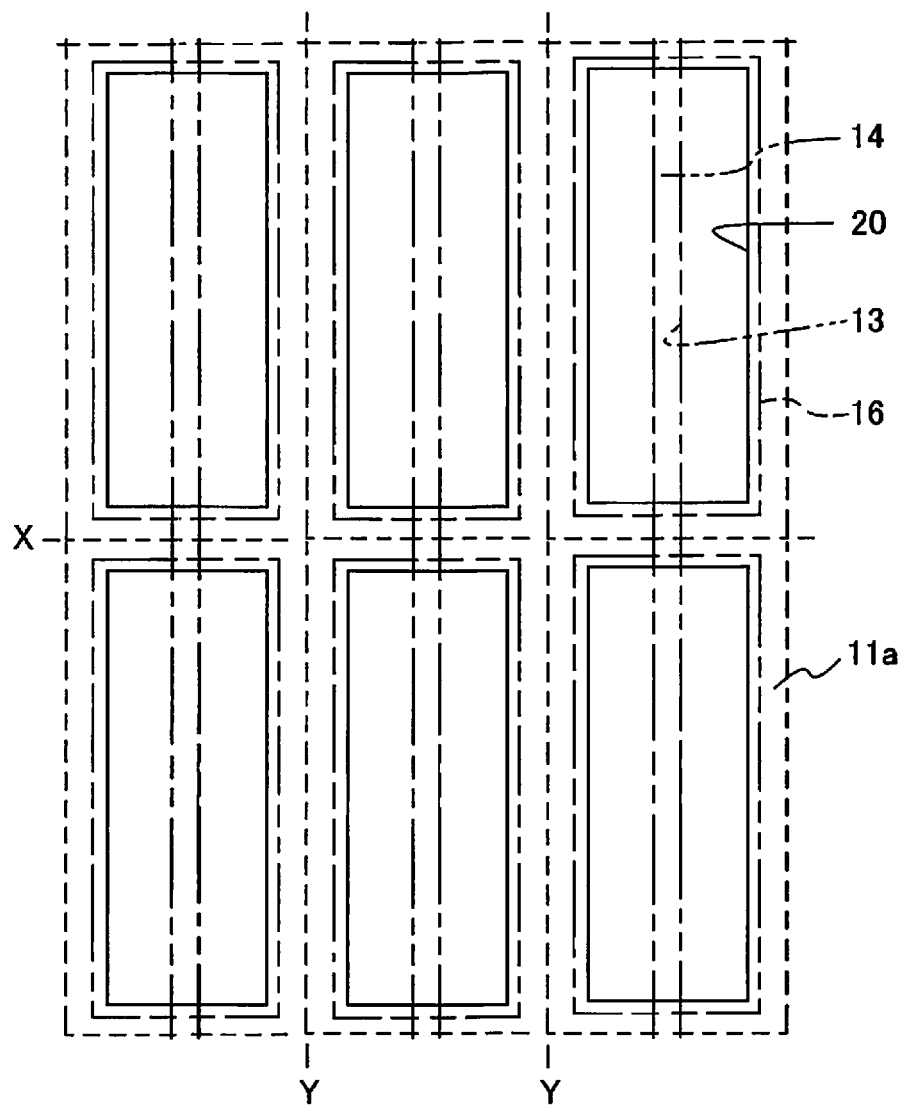
FIG. 1G is a schematic plan view showing the method of manufacturing the light emitting device of Example 1.
Figure 1H:
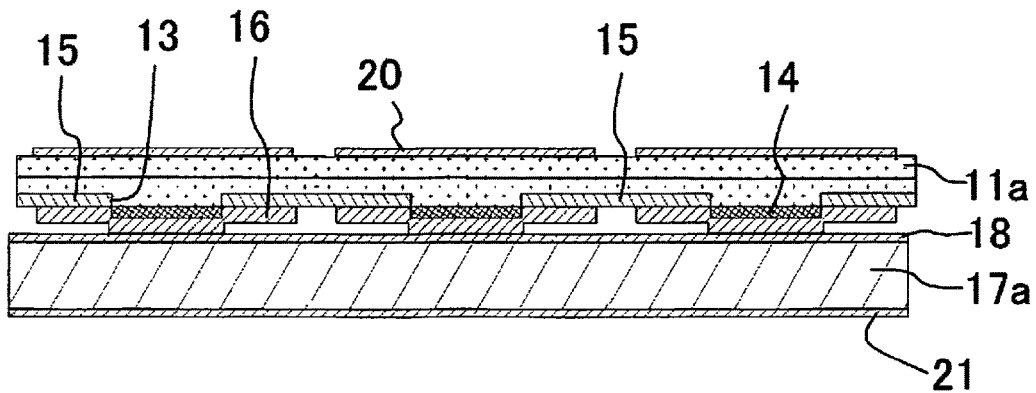
FIG. 1H is a schematic cross-sectional view showing the method of manufacturing the light emitting device of Example 1.
Figure 1I:
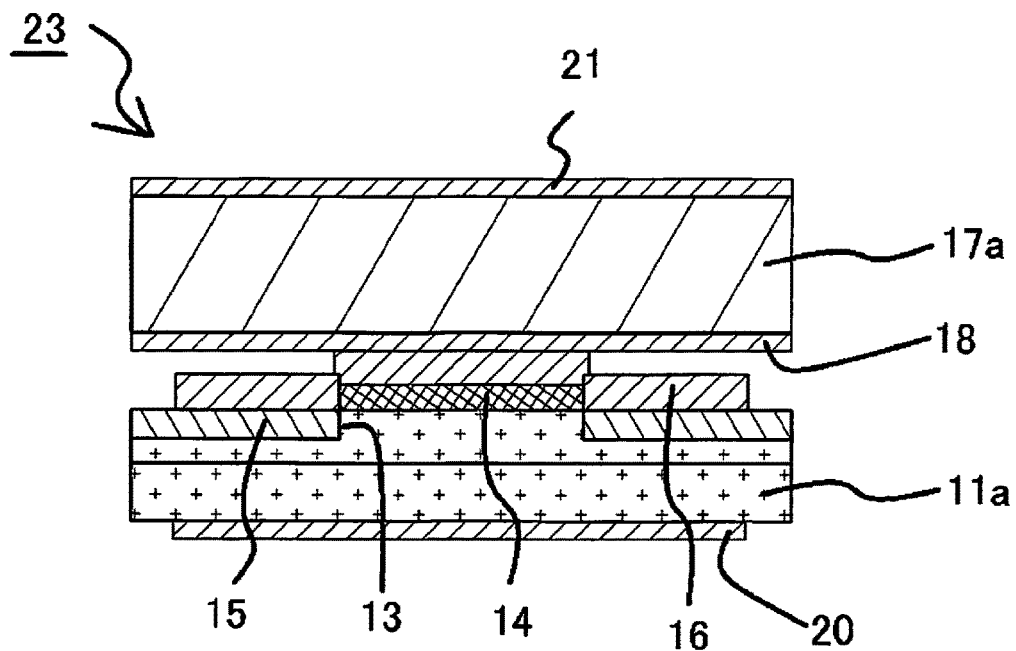
FIG. 1I is a schematic cross-sectional view showing the method of manufacturing of the light emitting device of Example 1.
Figure 1J:
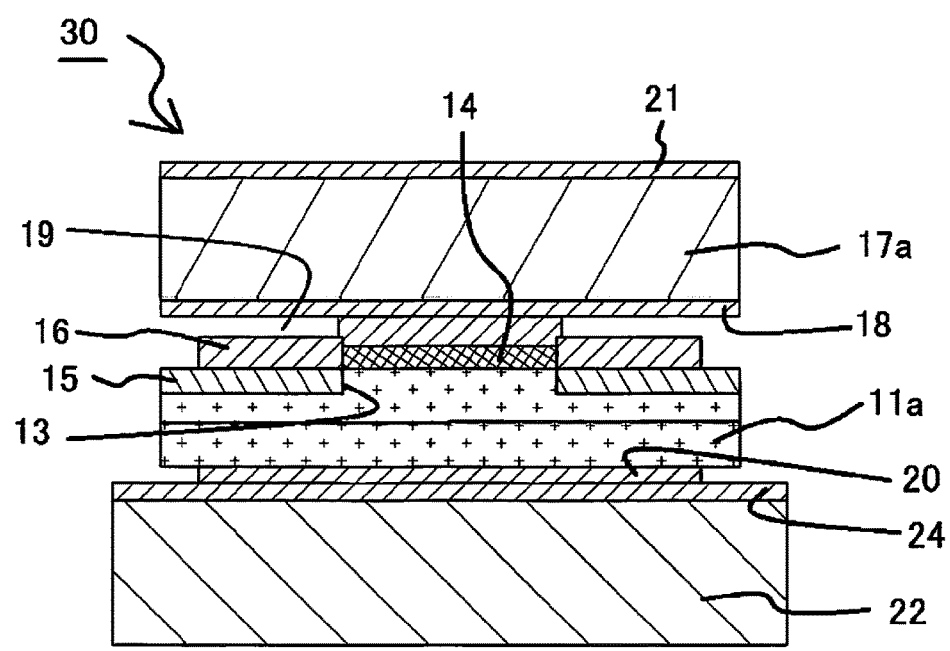
FIG. 1J is a schematic cross-sectional view showing the method of manufacturing the light emitting device of Example 1.

As shown in FIG. 1J, the light emitting device 30 includes a submount 22 and the laser element. The laser element includes a conductive first substrate 11a, a semiconductor layered body 12, which is the laser element structure formed on the first substrate 11a, an n-electrode 20, which is the lower surface electrode formed at the lower surface of the first substrate 11a, a first p-electrode 14 and a second p-electrode 16, which are the upper surface electrode formed at the upper surface of the semiconductor layered body 12, and a second substrate 17a bonded to the upper surface electrode. The first substrate 11 has a thickness smaller than a thickness of the second substrate 17a, and the submount 22 is bonded to the laser element via, for example, a bonding member 24 such as AuSn eutectic solder so as to face the n-electrode 20.

With this structure, the light emitting region of the laser element can be located closer to the submount. Accordingly, heat can be easily dissipated to the submount, so that the thermal resistance of the laser element can be reduced. Further, the necessity of providing an insulating layer between the light emitting region of the laser element and the submount can be eliminated, so that thermal resistance of the laser element can be further reduced.

Further, a portion of the first substrate remains in the laser element, so that the light emitting region can be located farther from the submount as compared with the case where the first substrate does not remain in the laser element. This allows for eliminates the necessity of arranging the laser element such that the light-emitting end surface is located at an outer side of the submount, or distance between the light-emitting end surface and the submount can be reduced. Accordingly, the thermal resistance of the laser element can be reduced.

Figure 4:
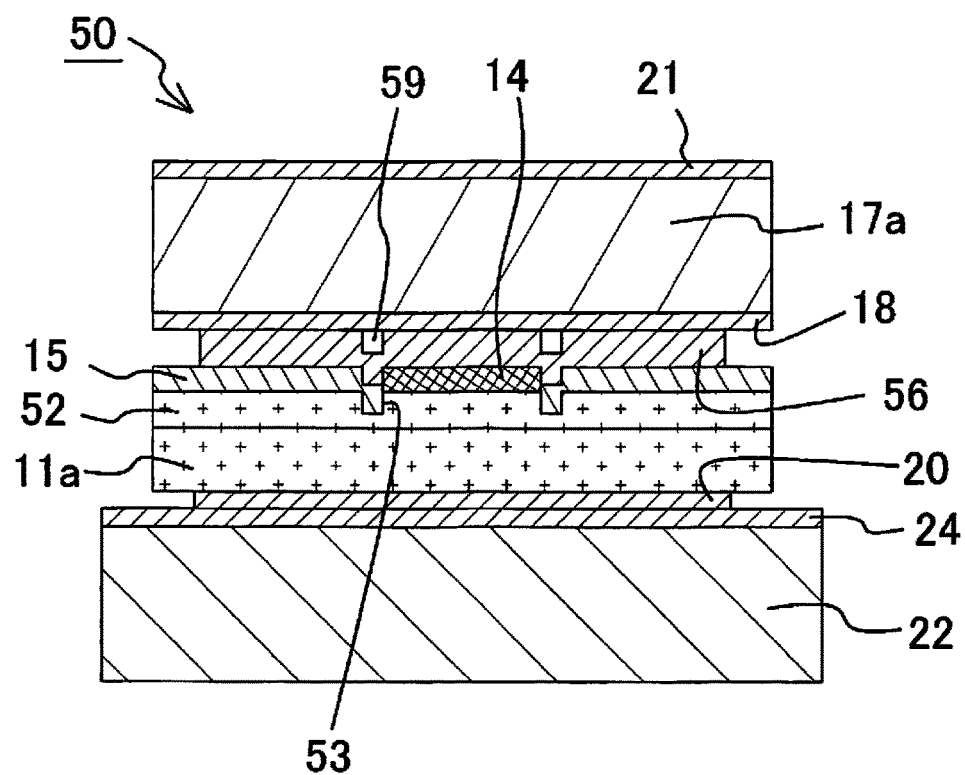
FIG. 4 is a schematic cross-sectional view showing a light emitting device of Example 2.
Figure 5:
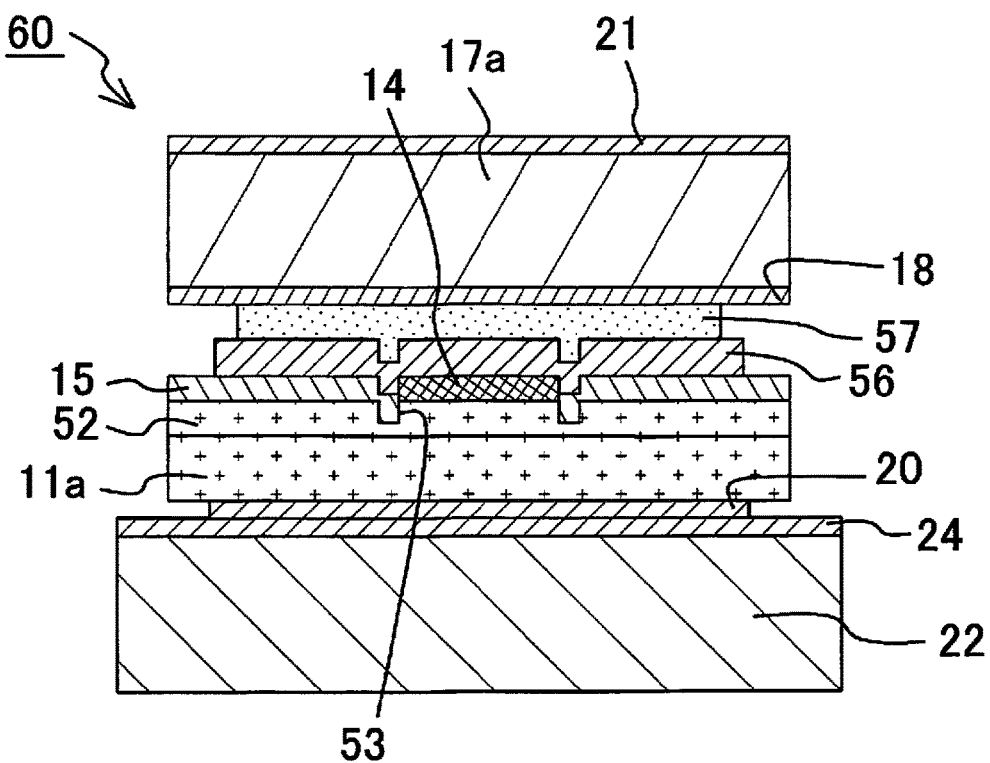
FIG. 5 is a schematic cross-sectional view showing a light emitting device of Example 3.

In the light emitting device 30, a gap 19 may be defined between the second p-electrode 16 and the conductive layer 18 facing the element structure of the second substrate 17a (19 in FIG. 1J, 59 in FIG. 4), or may not be defined (FIG. 5).

The laser element structure may have a stripe-shaped ridge 13 (FIG. 1.1). Alternatively, the laser element structure may have a mesa-shaped ridge 53 (FIGS. 4 and 5).

Further, an insulating layer 15 may be disposed on the upper surface of the semiconductor layered body 12 at both sides of the ridge 13.

The structure, material and the like of the members described in the method of manufacturing the light emitting device can be employed to the members of the light emitting device 30.

Example 1: Method of Manufacturing Light Emitting Device Providing Wafer

Firstly, as shown in FIG. 1A, the semiconductor layered body 12 in which an n-side semiconductor layer, an active layer, a p-side semiconductor layer were layered in order was formed on the +C-plane of a GaN substrate of φ 50.8 mm, which is the first substrate 11. For each layer, $In_xAl_yGa_{1-x-y}N$ ($0 \leq x \leq 1$, $0 \leq y \leq 1$, $0 \leq x+y \leq 1$) was used. Thereafter, the stripe-shaped ridge 13 (width: 35 µm, depth: 270 nm) was formed at the upper surface of the p-side semiconductor layer.

Next, as shown in FIGS. 1B and 1C, on substantially the entire surface of the ridge 13, the first p-electrode 14 made of an ITO film having a width of 32 µm and a thickness of 200 nm was formed. Thereafter, the insulating layer 15 made of $SiO_2$ and having a thickness of 200 nm was formed across the upper surface of the p-side semiconductor layer to the lateral surface of the ridge 13. Subsequently, the second p-electrode 16 (for example, Ni/Pd/Au/Pt/Au (thickness: 8 nm/200 nm/400 nm/200 nm/700 nm)) electrically connected to the first p-electrode 14 was formed to cover the upper surface of the first p-electrode 14 so as to extend over the insulating layer 15.

Bonding Wafer to Second Substrate

As shown in FIG. 1D, a Si substrate with the plane orientation {100}, an electrical resistance of 0.005 Ω·cm or less, and a thickness of 400 µm was provided as the second substrate 17. The expression "the plane orientation {100}" refers to that the plane orientation of the main surface is {100}.

On one surface of the second substrate 17, a film of Pt/Au (200 nm/700 nm) was formed using a sputtering device, so that a conductive layer 18 is obtained.

Be performing thermocompression bonding between the uppermost layer, which is a gold layer, of the conductive layer 18 of the second substrate 17 and the uppermost layer, which is a gold layer, of the second p-electrode 16, which is the upper surface electrode of the laser element structure in the wafer, at 7 kN and 280° C., metal bonding (Au—Au heat pressure bonding) was obtained, so that the wafer was bonded to the second substrate 17. By this bonding, the metal surface substantially does not deform, and, therefore, the gap 19 was defined by the upper surface of the second p-electrode 16 formed on the ridge 13 and the first p-electrode 14, at both sides of a projection of the second p-electrode 16 formed due to the ridge 13 and the first p-electrode 14 on the ridge.

Further, in this bonding, alignment is carried out such that the {111} plane of the Si substrate, which is the second substrate 17, generally corresponds to the M-plane of the first substrate 11 of the wafer (i.e., so as to become parallel to each other). The {111} plane of the second substrate 17 is not perpendicular to the {100} plane, which is the main surface of the substrate, and inclined. Therefore, the {111} plane of the second substrate 17 and the M-plane of the first substrate 11 are not parallel to each other in the strict sense.

Reducing Thickness of Wafer

As shown in FIG. 1E, a portion of the first substrate 11 was removed in the thickness direction, so that the thickness of the wafer was reduced.

The wafer was tentatively bonded to a sapphire substrate having a thickness of 2 mm via wax at the bonded second substrate 17 side in order to prevent the wafer from warping during reducing of the thickness of the first substrate 11, then the first substrate 11 was polished until a thickness of the first substrate achieved approximately 5 μm. At this time, as the finishing treatment of the polishing, CMP was performed. The in-plane distribution of the thickness was in a range of ±1.0 μm with the substrate of φ 50.8 mm.

Forming Lower Surface Electrode

As shown in FIGS. 1F and 1G, on a surface of the thinned first substrate 11a at which polishing was performed, (i.e., at the n-side semiconductor layer side), a film of Ti/Pt/Au (6 nm/200 nm/300 nm) was formed using a sputtering device, to form the n-electrode 20 as the lower surface electrode.

Thereafter, the sapphire substrate that had been tentatively bonded was removed. Subsequently, the first substrate 11 side of the wafer was similarly tentatively bonded to a sapphire substrate having a thickness of 2 mm using wax. Then, as shown in FIG. 1H, the second substrate 17 having a thickness of 400 μm was polished until a thickness of the second substrate 17 achieved 75 μm. By the polishing, the second substrate 17 can have a thickness suitable for the later operation of cleaving for singulating the second substrate 17. After the polishing the second substrate 17, the tentatively bonded sapphire substrate was removed. On the polished and thinned surface of the second substrate 17a, a film of Pt/Au (200 nm/700 nm) was formed using a sputtering device. Thus, the conductive layer 21 to be used for wire bonding after the mounting was formed.

In this manner, the structure that allows for supplying electricity to the first substrate 11 via the second substrate 17 when mounted was formed.

Singulating Wafer

In the obtained substrates in the bonded structure, grooves were formed on each of the first substrate 11 and the second substrate 17 along the same line in a plan view, for example, along the broken line X shown in FIG. 1G, using a laser scribing device. After the grooves were formed, the substrates were cleaved along the grooves using a substrate cleaving device, to form the resonator end surfaces of each laser element.

Thereafter, a dielectric multilayer film was formed at each resonator end surface. In the substrates with the bonded structure having been cleaved at the resonator end surfaces, grooves were formed in the direction perpendicular to the resonator end surfaces, for example, in the broken line Y direction shown in FIG. 1G using the laser scribing device. Thereafter, cutting was carried out to perform singulation into chips, as shown in FIG. 1I. Thus, laser elements 23 were obtained.

Mounting on Submount

As shown in FIG. 1J, the laser element 23 that had been bonded to the second substrate 17 and singulated was mounted on the submount 22 made of SiC via the bonding member 24 made of an eutectic solder such that the n-electrode 20 side of the laser element 23 faces the submount 22. Thus, the light emitting device 30 was obtained.

Evaluation of Light Emitting Device

Effect of Reducing Thermal Resistance

Figure 2:
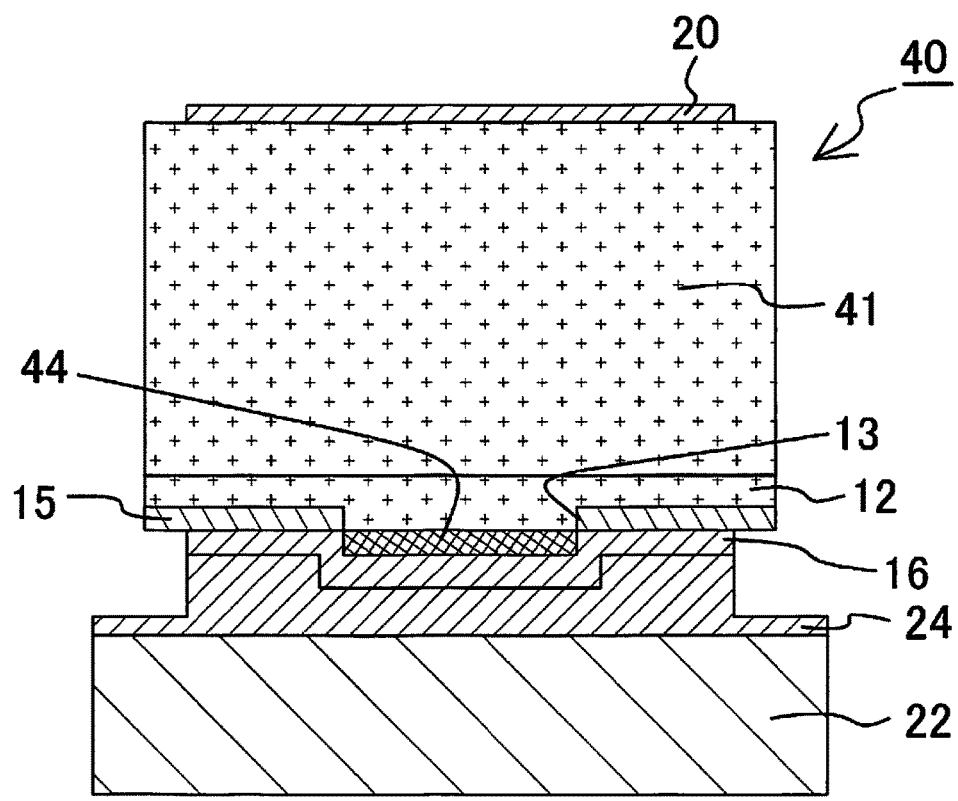
FIG. 2 is a schematic cross-sectional view showing a laser device of Comparative Example.

The thermal resistance of each of the light emitting device 30 obtained in the above-described manner and a light emitting device 40 of Comparative Example shown in FIG. 2 was measured. The light emitting device 40 of Comparative Example had a structure substantially the same as the light emitting device 30 of Example 1 except that the light emitting device 40 did not have the bonded structure, a substrate 41 had a thickness greater than the first substrate 11a, and the laser element was junction-down mounted.

In the laser element 23 of Example 1, a thickness of the first substrate 11a was 5 μm and a thickness of the second substrate 17a was 75 μm.

Accordingly, in the laser element of Comparative Example, a thickness of the substrate 41 was 80 μm.

Further, the laser element of Comparative Example had the semiconductor layered body 12 on one main surface side of the substrate 41, and had the stripe-shaped ridge 13 similarly to the laser element 23 of Example 1. On other main surface side of the substrate 41, an electrode similar to the n-electrode 20 of the laser element 23 of Example 1 was formed. On a surface of the semiconductor layered body 12, a first p-electrode 44 (an ITO film having a thickness of 200 nm, a thermal conductivity of 8 W/(m·K)), the insulating layer 15 and the second p-electrode 16 which are similar to those in Example 1 were formed. The laser element having such a structure was mounted on the submount 22 similar to that of the Example 1 via the bonding member 24 made of AuSn eutectic solder.

Each of the light emitting device 30 of Example 1 and the light emitting device 40 of Comparative Example was mounted on a package, and thermal resistance of each material of the light emitting device 30 of Example 1 and the light emitting device 40 of Comparative Example was estimated by the transient thermal resistance measurement using the cooling method (static method). As a result, the thermal resistance of the package and the submount did not largely differ between Example 1 and Comparative Example. On the other hand, thermal resistance of the laser element of the light emitting device of Example 1 was lower by 0.52 K/W than that of the light emitting device of Comparative Example.

In the laser element of Comparative Example, between the waveguide portion (near the active layer of the ridge portion), which is the heat source, and the submount, the p-electrode (an ITO film having a thickness of 200 nm, a thermal conductivity of 8 W/(m·K)) and the insulating layer (an $SiO_2$ film having a thickness of 200 nm, a thermal conductivity of 1 W/(m·K)) each having a low thermal conductivity were present. On the other hand, in the laser element of Example 1, the n-electrode (Ti/Pt/Au, thickness: 6 nm/200 nm/300 nm, thermal conductivity: Ti_17 W/(m·K), Pt_70 W/(m·K), Au_320 W/(m·K)) having a high thermal conductivity was present between the waveguide portion and the submount, so that the low thermal resistance value was obtained.

Effect of Reducing Voltage

The above-described light emitting device 30 of Example 1 and the light emitting device 40 of Comparative Example shown in FIG. 2 were caused to perform continuous lasing, and effect of reducing voltage was measured for each of them.

Figure 3:
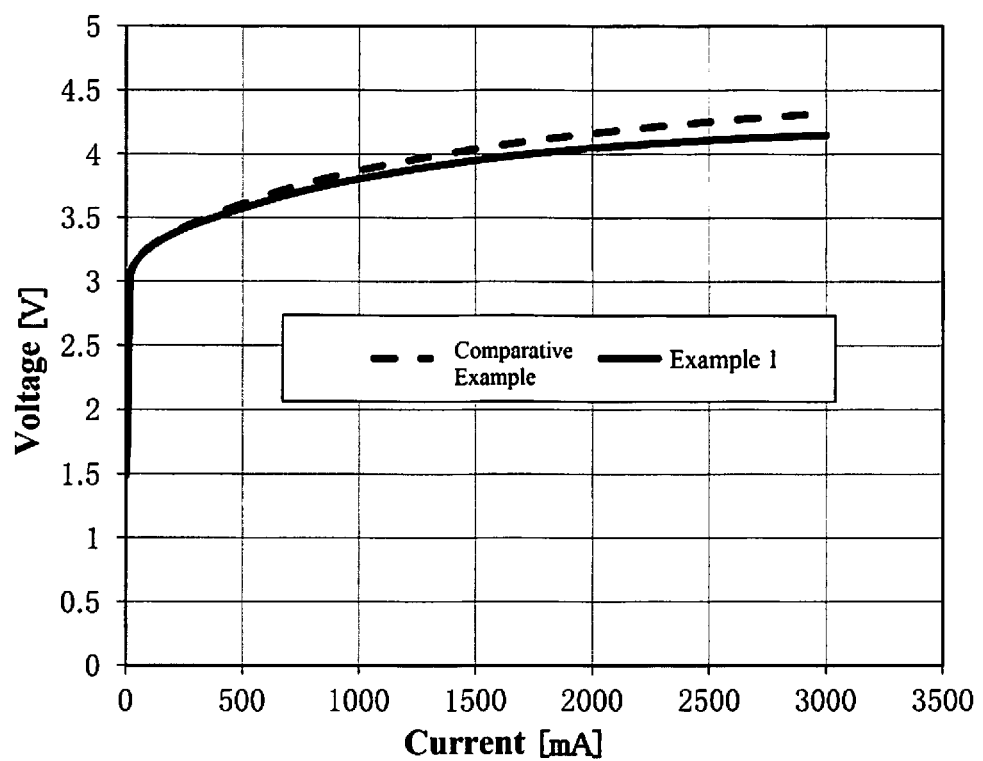
FIG. 3 is a graph showing the voltage-current curve of the laser device of Example 1 and the laser device of Comparative Example.

FIG. 3 shows the current-voltage measurement result.

With reference to FIG. 3, a voltage of the light emitting device of Example 1 lower than the light emitting device using the laser element of Comparative Example (more specifically, lower by 0.17 V at 3.0 A) was measured.

The laser element of Comparative Example included the substrate 41 (thickness: 80 µm, electrical resistance: 0.01 Ω·cm). On the other hand, the laser element of Example 1 included the first substrate 11a having a thickness of 5 µm and the second substrate 17a made of Si and having a thickness of 75 µm (electrical resistance: ≤0.005 Ω·cm), which exhibited good effect of reducing voltage.

Example 2: Method of Manufacturing Light Emitting Device

In Example 2, a Si substrate having the plane orientation {111} was used as the second substrate. Then, the {110} plane, which is perpendicular to the {111} plane, was used as the cleaving plane.

Thus, the cleaving plane substantially perpendicular to the {111} plane, which is the main surface of the second substrate, was obtained.

Further, in Example 2, the light emitting device was manufactured substantially in the same manner as in Example 1 except for the plane orientation of the second substrate. Accordingly, similarly to Example 1, the effect of reducing thermal resistance and the effect of reducing voltage are expected to be exhibited.

Example 3: Method of Manufacturing Light Emitting Device

As shown in FIG. 4, a light emitting device 50 of Example 3 was fabricated similarly to Example 1, except that the element structure of the wafer had, instead of the stripe-shaped ridge, a mesa-shaped ridge 53 having lateral surfaces each of which is apart from the upper surface of the second semiconductor layer via a groove with a width of 5 µm was provided.

When bonding of the wafer having such an element structure to the second substrate 17 is performed similarly to Example 1, the bonded area between the element structure and the second substrate 17 was different between Example 1 and Example 3. That is, in Example 3, a semiconductor layered body 52, which is the element structure, had the mesa-shaped ridge structure, so that a portion other than the groove having a width of 5 µm from a lateral surface has the same height as a height of the ridge. Further, the first p-electrode 14 (an ITO film having a thickness of 200 nm) has the same thickness as a thickness of the insulating layer 15 (an SiO$_2$ film having a thickness of 200 nm). Accordingly, the second p-electrode 56 (having a width of 120 µm) had a uniform height as an entirety other than a portion corresponding to a groove having a width of 5 µm in the semiconductor layered body 52. Thus, substantially an entirety of a surface of second p-electrode 56 was bonded to the conductive layer 18 of the second substrate 17 by the heat pressure bonding.

As a result, a gap 59 was defined only in a region corresponding to the groove having a width of 5 µm from the ridge lateral surface. Thus, as compared with Example 1, an improvement in bonding strength between the first substrate 11 and the second substrate 17 can be expected.

Example 4: Method of Manufacturing Light Emitting Device

A light emitting device 60 of Example 4 was fabricated similarly to Example 3, except that a film of Ni/Sn (500 nm/1100 nm) was formed on the Au uppermost layer of each of the second p-electrode 56, which is one of the upper surface electrodes of the element structure, and the conductive layer 18 on the second substrate 17a. The Ni/Sn films were made to face each other, and as shown in FIG. 5, thermocompression bonding was performed similarly to Example 1, so that an NiSn bonding layer 57 was formed. Thus, the two substrates were bonded to each other.

As a result, the gap in the second p-electrode 56 corresponding to the groove in the semiconductor layered body 52 having a width of 5 µm from the ridge lateral surface in Example 3 can be filled by liquid phase bonding using NiSn. Thus, the light emitting device 60 had a greater bonded area than that in Example 3. Accordingly, an improvement in bonding strength can be expected.

What is claimed is:

1. A method of manufacturing a light emitting device, the method comprising:
    providing a wafer including a conductive first substrate, a laser element structure on an upper side of the first substrate, and an upper surface electrode on an upper surface of the laser element structure;
    bonding the wafer to a second substrate at an upper surface electrode side of the wafer;
    removing a portion of the first substrate to reduce a thickness of the wafer;
    forming a lower surface electrode on a lower surface of the first substrate at which the removing of the portion of the first substrate has been performed;
    singulating the wafer to obtain a laser element; and
    mounting the laser element on a submount such that the lower surface electrode faces the submount.

2. The method of manufacturing a light emitting device according to claim 1, wherein
    the singulating of the wafer includes forming a groove for dividing the wafer in the second substrate and singulating the wafer along the groove.

3. The method of manufacturing a light emitting device according to claim 2, wherein
    the forming of the groove for dividing the wafer includes forming a plurality of grooves that collectively constitute a broken line configuration in a plan view.

4. The method of manufacturing a light emitting device according to claim 1, wherein
    the removing of the portion of the first substrate includes removing the portion of the first substrate by polishing and/or dry etching.

5. The method of manufacturing a light emitting device according to claim 1, wherein
    each of the first substrate and the second substrate is a crystalline substrate having an easy-cleavage plane,
    the bonding of the wafer to the second substrate includes bonding the wafer to the second substrate so that the easy-cleavage plane of the first substrate and the easy-cleavage plane of the second substrate are disposed parallel to each other.

6. The method of manufacturing a light emitting device according to claim 1, wherein
    the first substrate is a GaN substrate, and the second substrate is a Si substrate.

7. The method of manufacturing a light emitting device according to claim 1, wherein
    the providing of the wafer includes providing the wafer having
        the laser element structure including a ridge on an upper side, and an insulating layer formed on the upper surface of the laser element structure at each of both sides of the ridge.

8. The method of manufacturing a light emitting device according to claim 1, wherein
the providing of the wafer includes providing the wafer having the laser element structure including, in order from the first substrate, an n-side semiconductor layer, an active layer, and a p-side semiconductor layer.

9. The method of manufacturing a light emitting device according to claim 1, wherein
the providing of the wafer includes providing the wafer having the laser element structure including a GaN-based semiconductor.

10. The method of manufacturing a light emitting device according to claim 1, wherein
the submount is an SiC submount or an AlN submount.

11. A light emitting device comprising:
a laser element including
a conductive first substrate,
a laser element structure on an upper side of the first substrate,
a lower surface electrode on a lower surface of the first substrate,
an upper surface electrode on an upper surface of the laser element structure, and
a second substrate bonded to the upper surface electrode,
the first substrate having a thickness smaller than a thickness of the second substrate; and
a submount bonded to the laser element such that the submount faces the lower surface electrode.

12. The light emitting device according to claim 11, wherein
the second substrate has an electrical resistance lower than an electrical resistance of the first substrate.

13. The light emitting device according to claim 11, wherein
the first substrate is a GaN substrate, and the second substrate is a Si substrate.

14. The light emitting device according to claim 11, wherein
the laser element structure includes a ridge at an upper side of the laser element structure, and
the laser element further includes an insulating layer formed on the upper surface of the laser element structure at each of both sides of the ridge.

15. The light emitting device according to claim 11, wherein
the laser element structure includes, in order from the first substrate, an n-side semiconductor layer, an active layer, and a p-side semiconductor layer.

16. The light emitting device according to claim 11, wherein
the laser element structure includes a GaN-based semiconductor.

17. The light emitting device according to claim 11, wherein
the submount is an SiC submount or an AlN submount.

* * * * *